(12) United States Patent
Figueroa et al.

(10) Patent No.: US 6,558,169 B2
(45) Date of Patent: May 6, 2003

(54) SHUNT POWER CONNECTION FOR AN INTEGRATED CIRCUIT PACKAGE

(75) Inventors: David G. Figueroa, Mesa, AZ (US); Yuan-Liang Li, Chandler, AZ (US); Hong Xie, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 09/821,699

(22) Filed: Mar. 29, 2001

(65) Prior Publication Data

US 2002/0142628 A1 Oct. 3, 2002

(51) Int. Cl.[7] .............................................. H01R 12/00
(52) U.S. Cl. ......................................... 439/70; 361/776
(58) Field of Search ..................... 439/70, 71; 361/760, 361/776, 780, 783, 794

(56) References Cited

U.S. PATENT DOCUMENTS

| | | | |
|---|---|---|---|
| 3,910,664 A | 10/1975 | Pauza et al. ................... 439/71 |
| 3,951,495 A | * 4/1976 | Donaher et al. ............. 439/330 |
| 4,037,270 A | * 7/1977 | Ahmann et al. ........... 174/52.4 |
| 4,089,575 A | * 5/1978 | Grabbe ....................... 174/52.4 |
| 5,104,327 A | 4/1992 | Walburn ....................... 439/71 |
| 5,444,298 A | * 8/1995 | Schutz ........................ 257/691 |
| 5,556,811 A | 9/1996 | Agatstein et al. ........... 437/209 |
| 5,628,635 A | * 5/1997 | Ikeya .......................... 439/515 |
| 5,895,230 A | 4/1999 | Bartley ........................ 438/40 |
| 5,923,086 A | 7/1999 | Winer et al. ................. 257/713 |
| 6,031,283 A | 2/2000 | Banerjee et al. ............. 257/698 |
| 6,184,477 B1 | 2/2001 | Tanahashi .................... 174/261 |
| 6,328,574 B1 | * 12/2001 | Howell et al. ................. 439/69 |

OTHER PUBLICATIONS

Polka et al., "Package–Level Interconnect Design for Optimum Electrical Performance", Intel Technology Journal Q3, 2000, pp. 1–17.

Mahajan et al., "The Evolution of Microprocessor Packaging", Intel Technology Journal Q3, 2000, pp. 1–10.

* cited by examiner

Primary Examiner—Tulsidas Patel
(74) Attorney, Agent, or Firm—Fish & Richardson P.C.

(57) ABSTRACT

An apparatus includes a socket and a housing. The socket and the housing can define an interior region for receiving an integrated circuit package. The housing includes a conductive member with a first portion exposed adjacent a bottom surface of the housing and a second portion at a side surface adjacent the interior region. The first portion can be electrically in contact with a printed circuit board. The second portion can be electrically in contact with a conductive member at a side surface of the integrated circuit package.

26 Claims, 12 Drawing Sheets

SHUNT POWER CONNECTION FOR AN INTEGRATED CIRCUIT PACKAGE

BACKGROUND

The invention relates to a shunt power connection for an integrated circuit package.

A socket electrically connects pins of a package to a printed circuit board. A package can contain various circuit elements as well as conductive paths such as vias for carrying input/output (I/O) signals or power for integrated circuits on a die connected to the package.

Depending on a particular die's power requirements, additional vias may be required to deliver large amounts of current through a package to a die. This can result in high operating temperatures within a package.

Industry trends of reducing device sizes and increasing package densities also can result in high current densities and, consequentially, high operating temperatures inside packages.

High integrated circuit power requirements may require that a large number of available pin/socket combinations be dedicated to deliver power. Therefore, fewer pin/socket combinations may be available for I/O signal delivery.

DETAILED DESCRIPTION

Figure 1A:
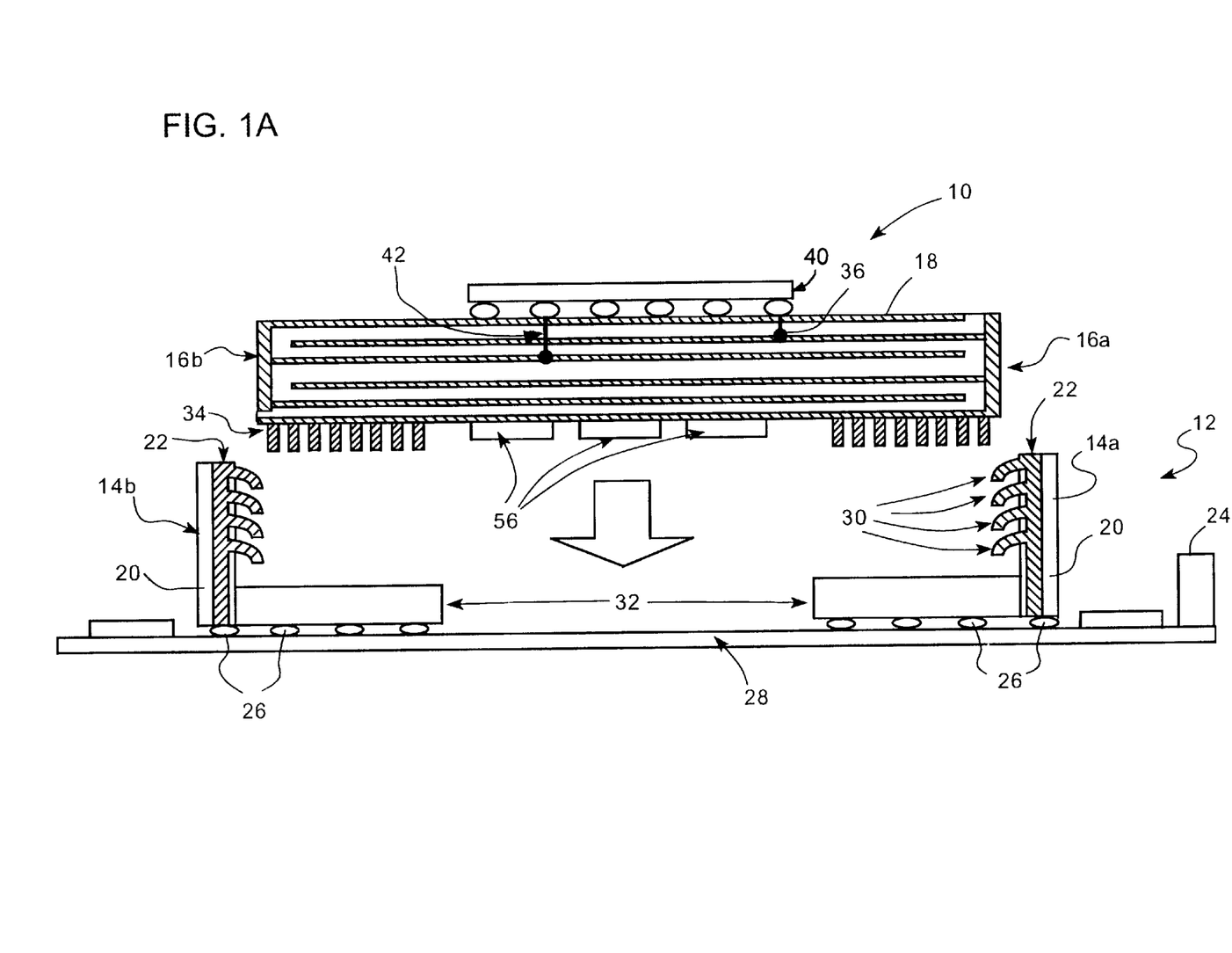
FIGS. 1A and 1B are sectional views of a package assembly with shunt power connections.
Figure 1B:
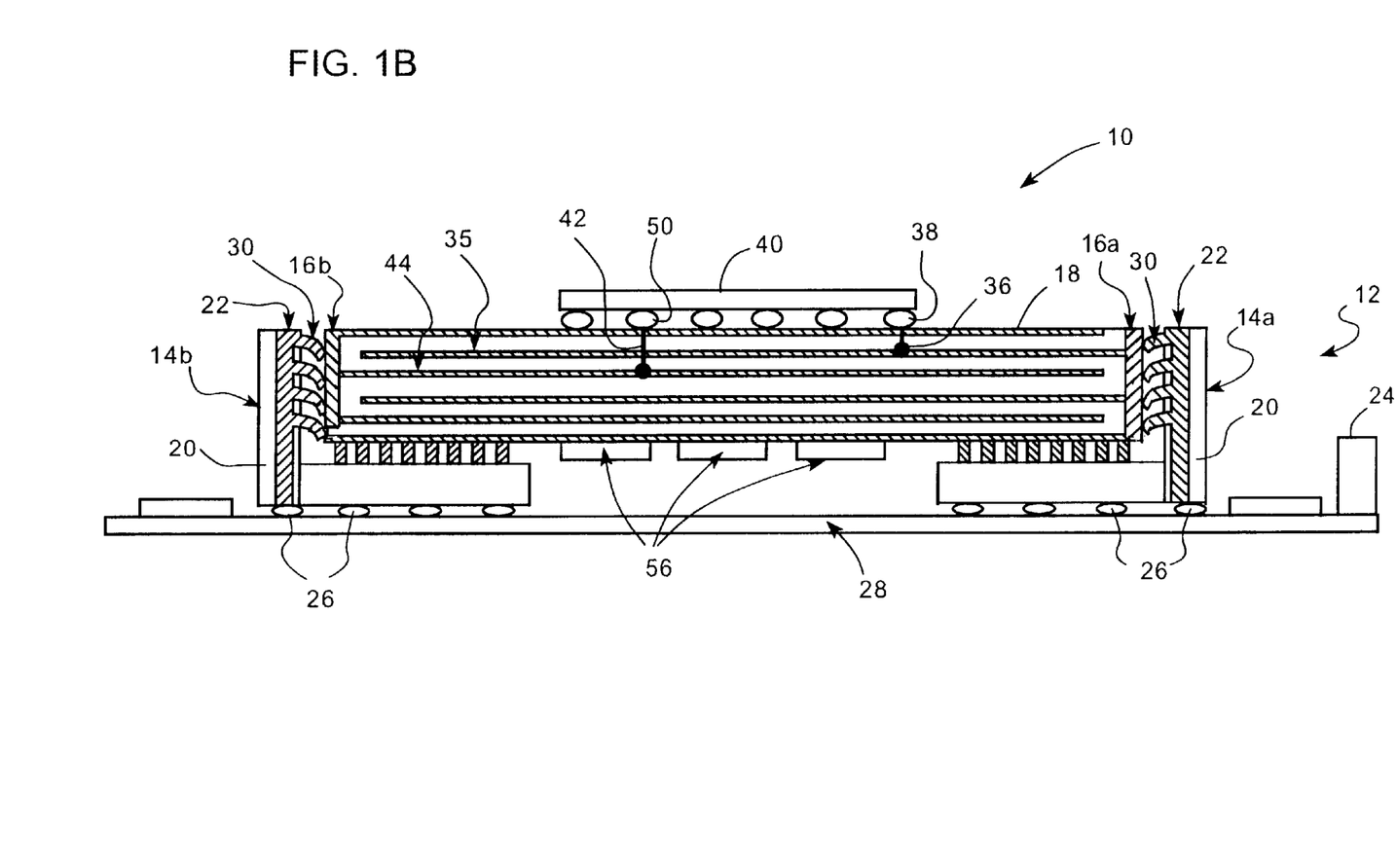

A package assembly 10 and a socket assembly 12 can be connected to each other as illustrated in FIGS. 1A and 1B. When the assemblies are connected to each other, shunt power connections 14a, 14b can deliver power to the package assembly 10 through contacts 16a, 16b located on the side surfaces of a package 18.

Each shunt power connection 14a, 14b includes a dielectric housing 20 and a conductive member 22. The dielectric housing 20 may be formed using a polymer material that may be thermoplastic or thermosetting. Examples of housing materials include polyamides, FR-4 epoxy, polybutylene terepthalate (PBT), polyethylene terepthalate (PET), polycyclohexylenedimethylene terepthalate (PCT), polyphenylene sulfide (PPS), cyanate ester, and liquid crystal polymers.

A first portion of the conductive member 22 is exposed at the bottom surface of the housing 20 and is connected through socket bumps 26 to a printed circuit board 28. A second portion of the conductive member 22 includes conductive fingers 30 that extend through openings in a side surface of the housing 20. The fingers 30 may be flexible and are positioned to mate with the contacts 16a, 16b on the package 18. The fingers 30 also may apply a holding force to the package 18. A third portion of the conductive member 22 is embedded within the housing 20.

Each shunt power connection 14a, 14b is positioned next to a traditional pin grid array (PGA) socket 32 so that when pins 34 of the package 18 mate with the PGA socket 32, the fingers 30 become electrically coupled to the contacts 16a, 16b.

When assembled, current can flow, for example, from the power supply 24, through a conductive path in the printed circuit board 28 and through socket bumps 26. The shunt power connection 14a carries current to a contact 16a located on a side of the package 18. Current flows through a power plane 35 positioned horizontally inside the package 18, through a via 36, through a die bump 38 and into the die 40.

Current can return to a system ground point at the power source 24 by flowing, for example, from the die 40 through a die bump 38 and into the package 18. The current flows through a via 42 in the package 18, through a ground plane 44 positioned horizontally inside the package 18, and through a contact 16b. The shunt ground connection 14b carries current from the contact 16b to a socket bump 26. Current then flows into the printed circuit board 28 and returns to a system ground point at the power supply 24.

Each conductive pin 34 that extends from the bottom surface of the package 18 can carry I/O data signals, other signals or power. Power supplied by the shunt power connections 14a, 14b can supplement the power carried by the pins 34.

Decoupling capacitors 56 are mounted to the package 18 and can provide supplemental current to the die 40 under heavy loading conditions. Such supplemental current may be required if current supplied by the power supply 24 becomes limited by the impedance of the conductive path between the power supply and the die 40. The impedance of the conductive path can affect the required size of the decoupling capacitors 56.

Figure 2:
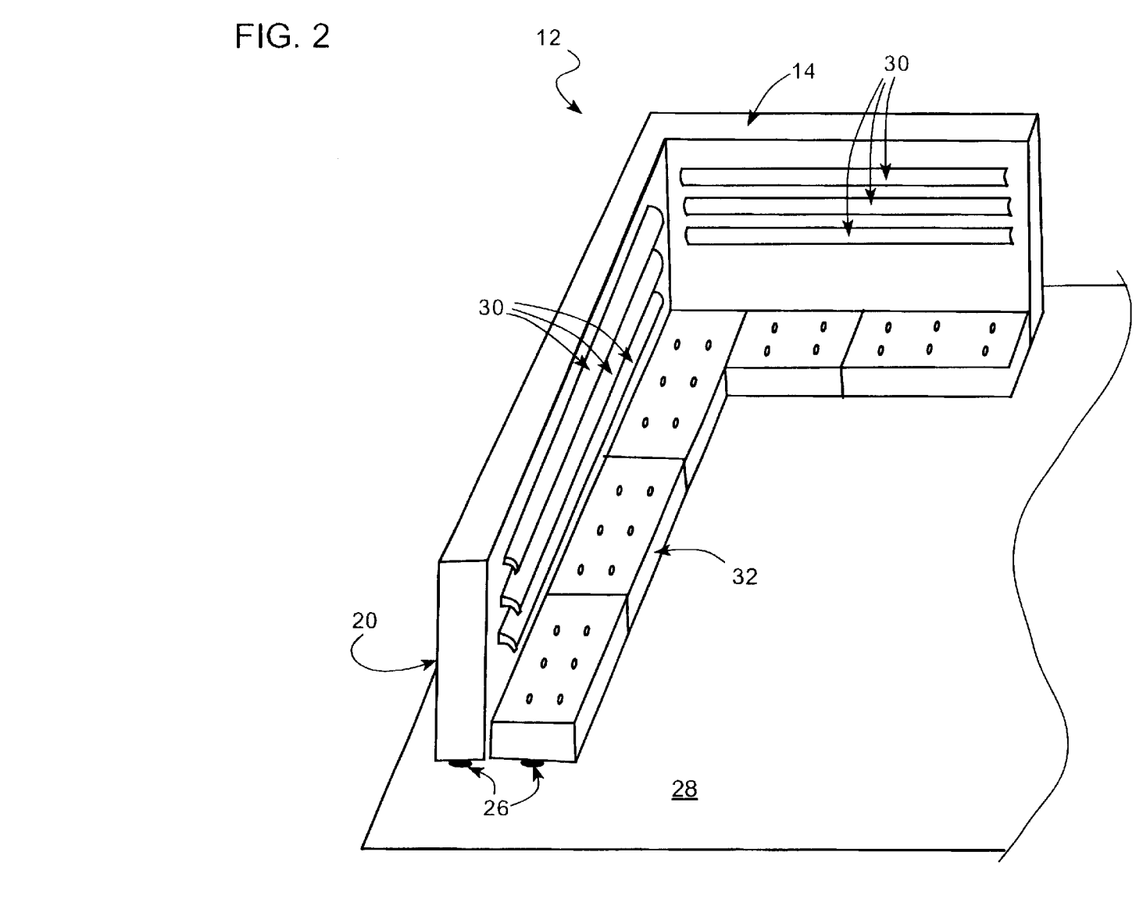
FIG. 2 is a perspective view of a shunt power connection.

The shunt power connection illustrated in FIG. 2 includes two sections that are substantially perpendicular to each other. Each section includes a set of three contacts 30 that span almost entirely across the width of each section. Each set of contacts 30 is configured to mate with a corresponding conductive contact exposed at a side surface of a package.

Figure 3A:
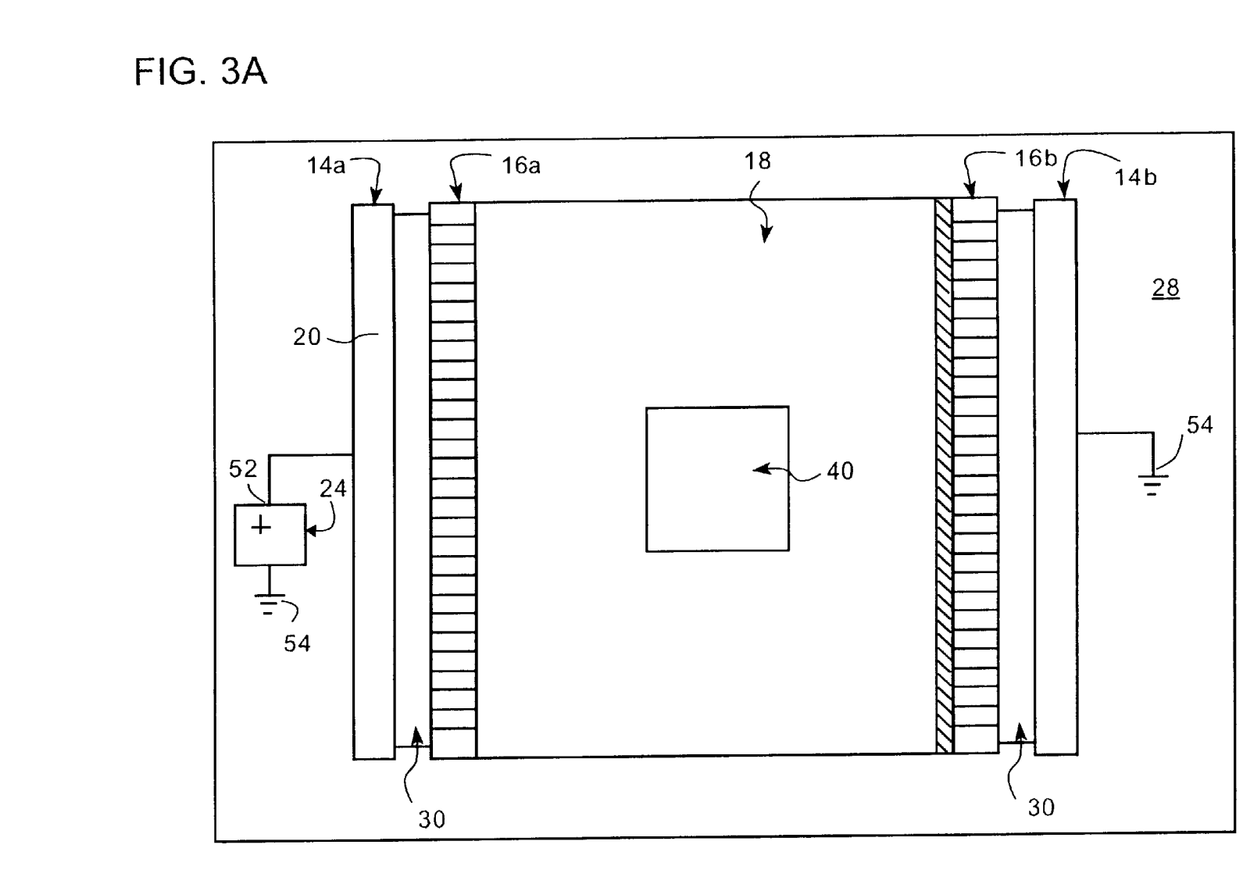
FIGS. 3A and 3B are plan and cross sectional views, respectively, of a package assembly with shunt power connections.
Figure 3B:
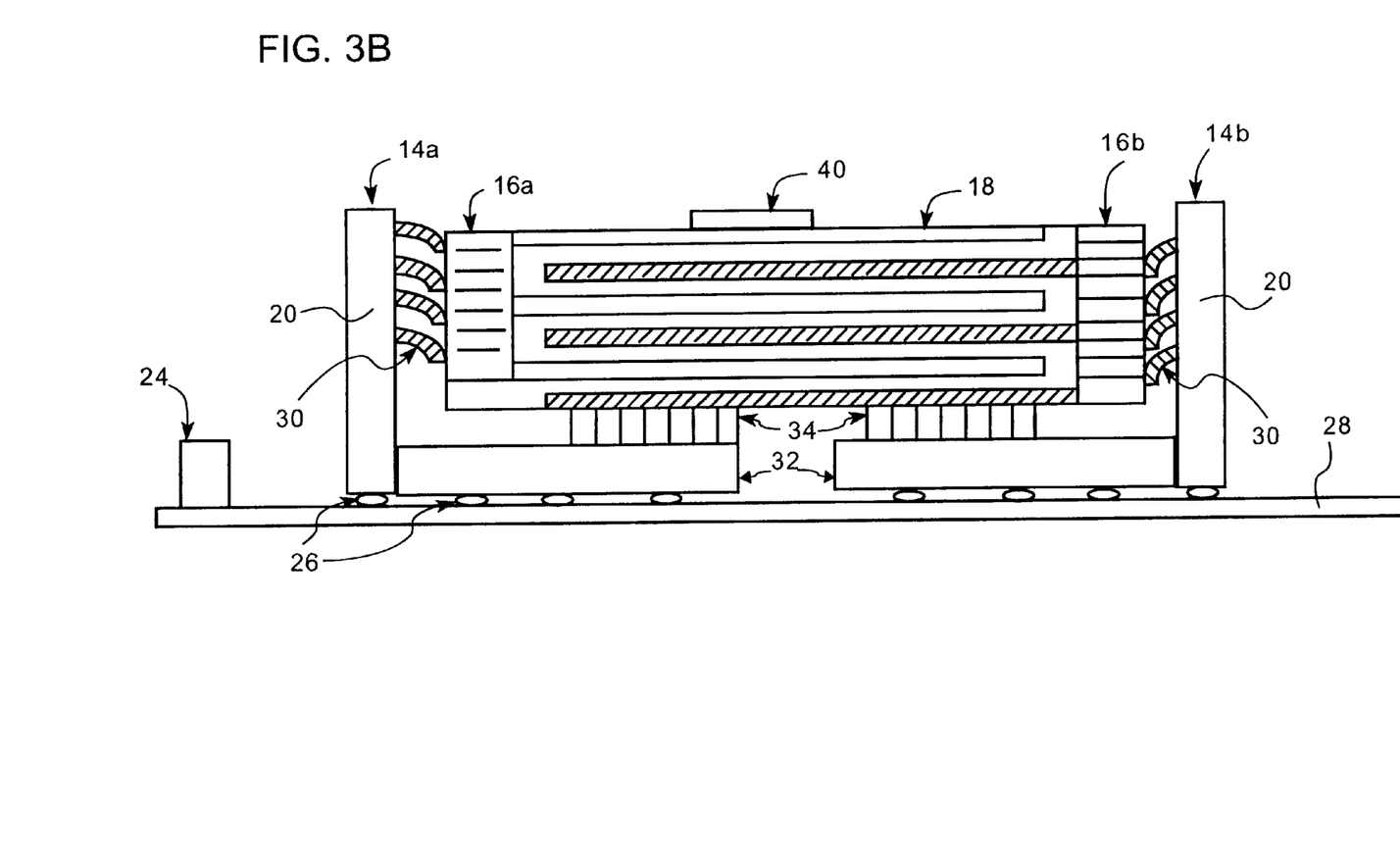

A variety of shunt power connection arrangements are possible. As shown in FIGS. 3A and 3B, each shunt power connection 14a, 14b can be configured to provide a conductive path between a printed circuit board 28 and contacts 16a, 16b that span opposite sides of a package 18. Shunt power connection 14a is electrically coupled to a positive terminal 52 of a power supply 24 and shunt power connection 14b is electrically coupled to a system ground point 54.

Figure 4A:
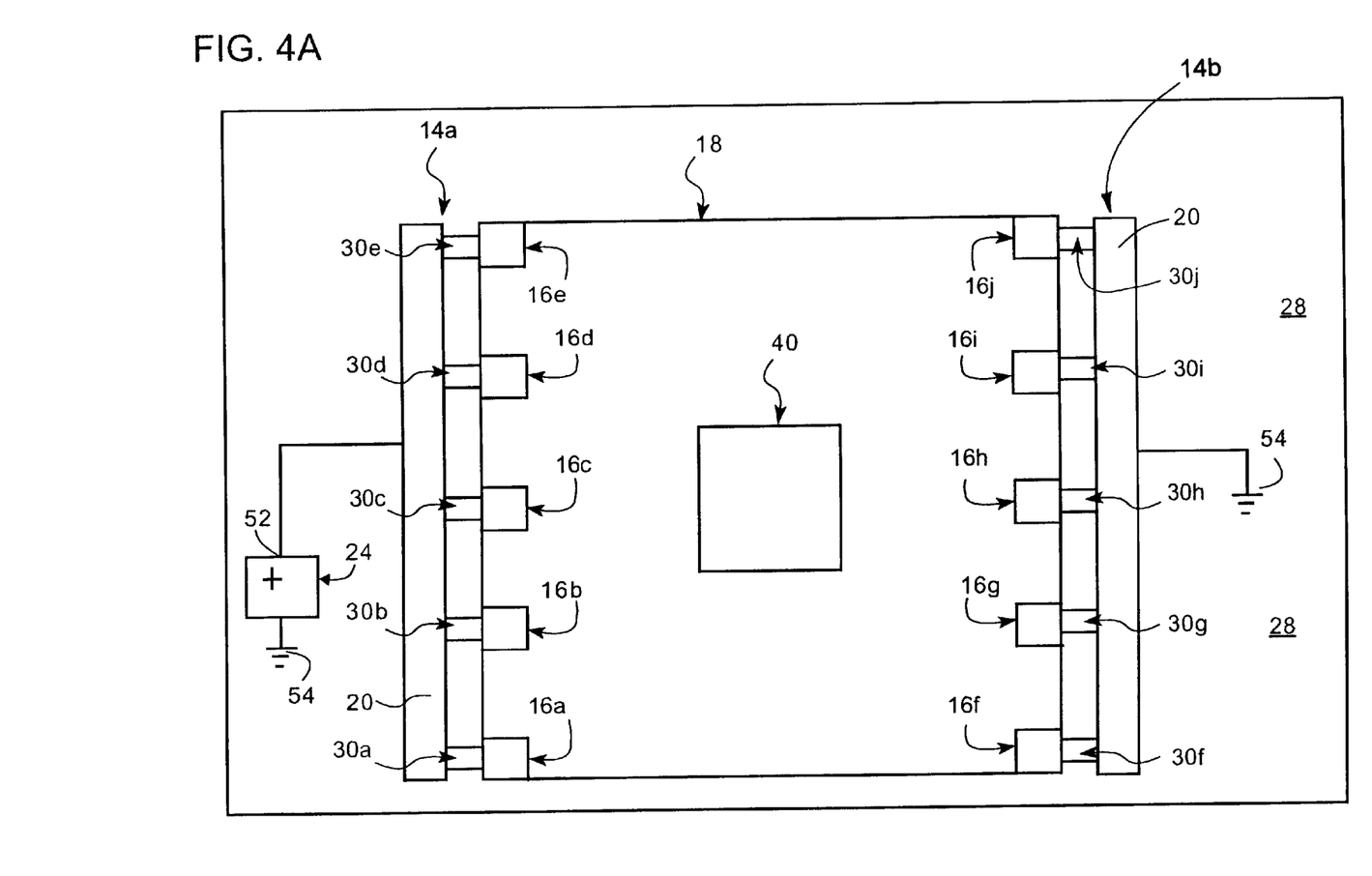
FIGS. 4A and 4B are plan and cross sectional views, respectively, of a package assembly with shunt power connections.
Figure 4B:
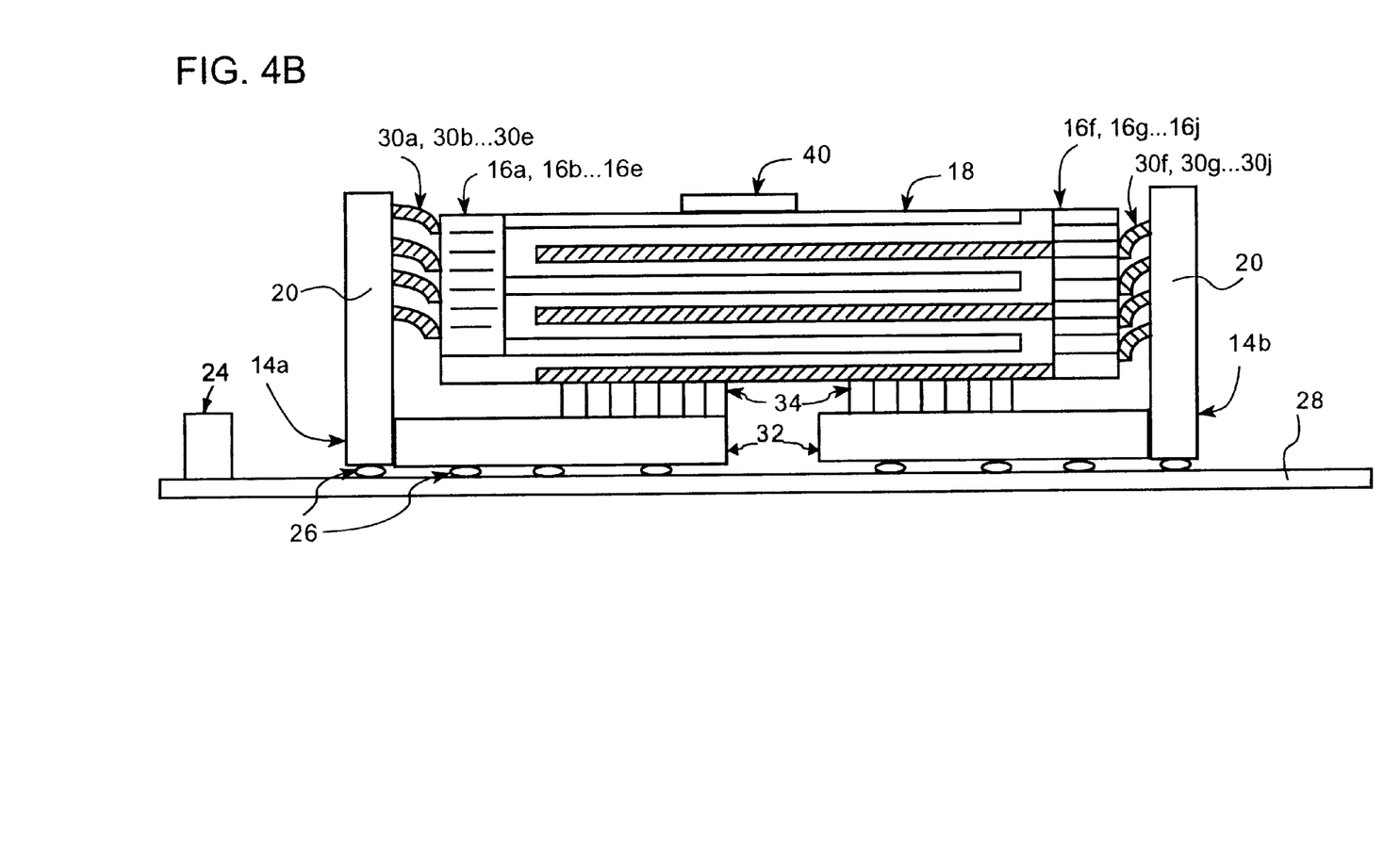

Another shunt power connection configuration is illustrated in FIGS. 4A and 4B. The package 18 includes contacts 16a, 16b . . . 16j arranged on opposite sides of the package 18. Shunt power connections 14a, 14b provide conductive paths between the printed circuit board 28 and the contacts 16a, 16b . . . 16j. Each shunt power connection 14a, 14b includes groups 30a, 30b . . . 30j of conductive fingers arranged to mate with corresponding contacts 16a, 16b . . . 16j positioned across opposite sides of the package 18. Shunt power connection 14a is electrically coupled to a positive terminal 52 of the power supply 24 and shunt power connection 14b is electrically coupled to a system ground point 54.

Figure 5A:
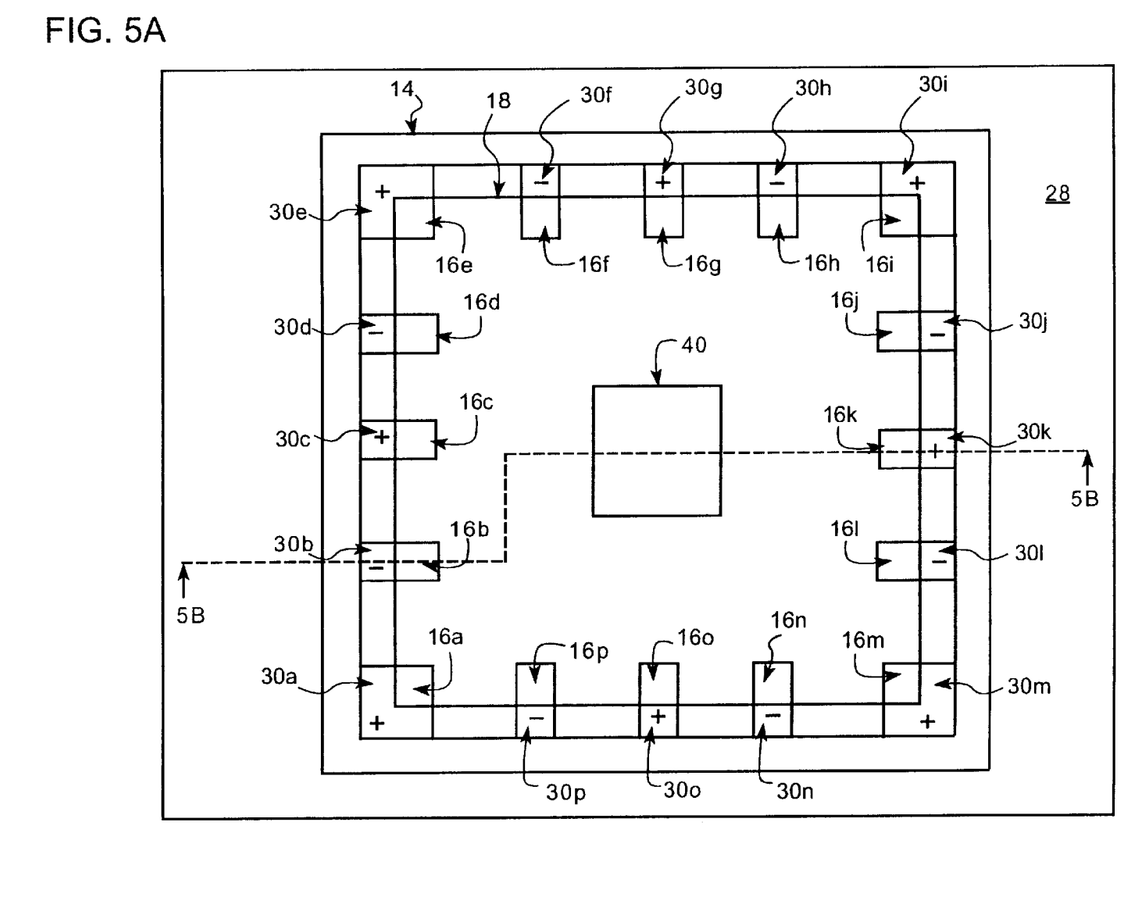
FIGS. 5A and 5B are plan and cross sectional views, respectively, of a package assembly with shunt power connections.
Figure 5B:
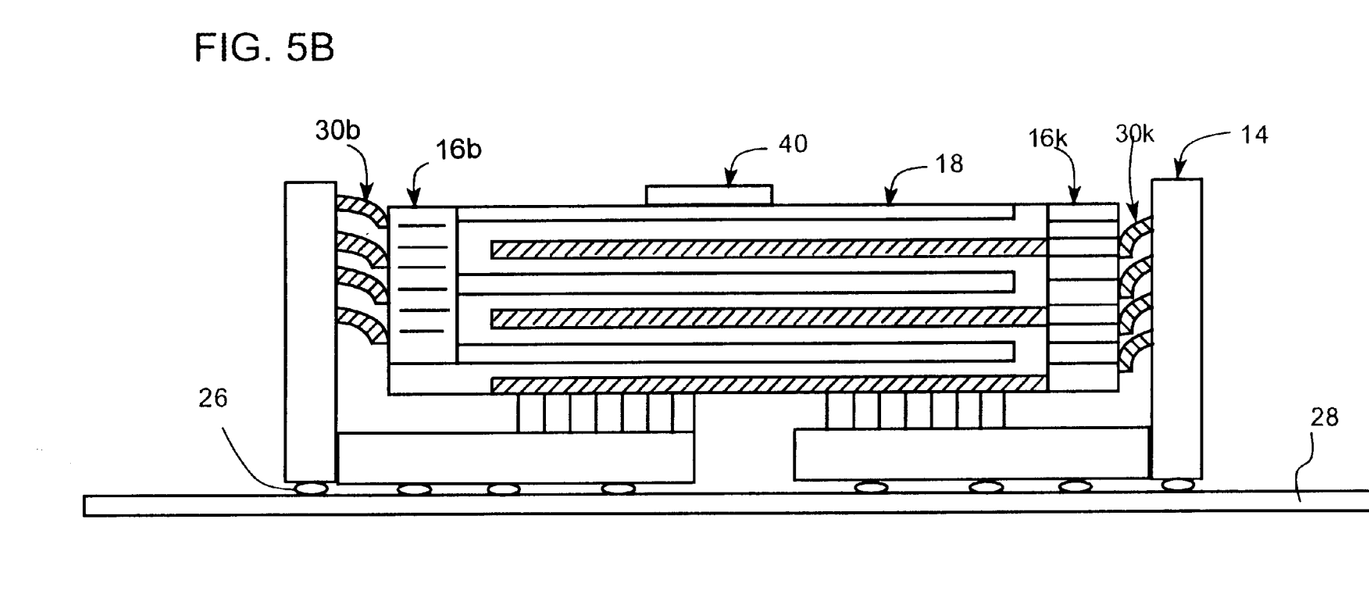

The shunt power connection arrangement of FIGS. 5A and 5B includes a shunt power connection 14 that has a substantially rectangular footprint. The shunt power connection 14 surrounds the perimeter of a substantially rectangular package 18 and includes groups 30a, 30b . . . 30p of conductive fingers arranged to mate with corresponding contacts 16a, 16b . . . 16p positioned around each of the four sides of the package 18. Adjacent groups of fingers (e.g., 30a and 30b) have opposite polarities.

Figure 6A:
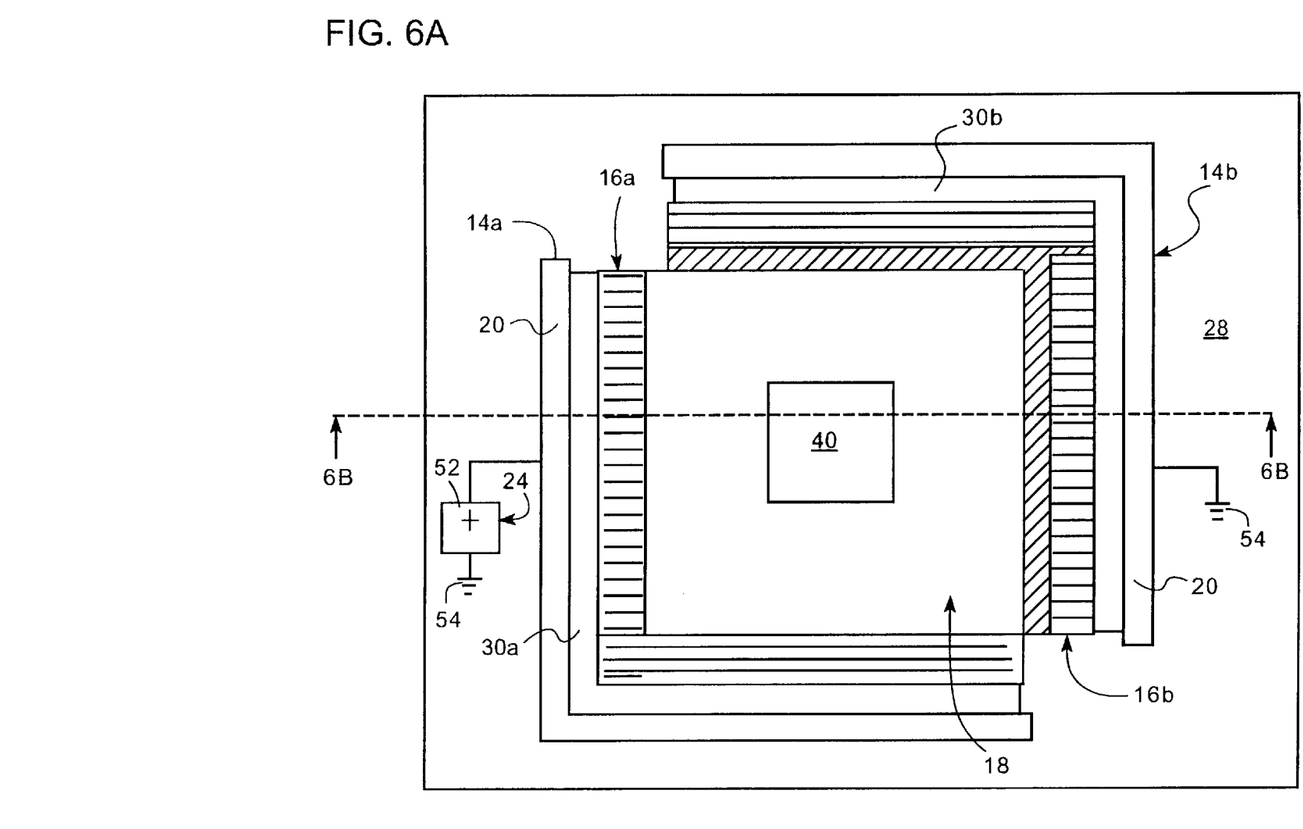
FIGS. 6A and 6B are plan and cross sectional views, respectively, of a package assembly with shunt power connections.
Figure 6B:
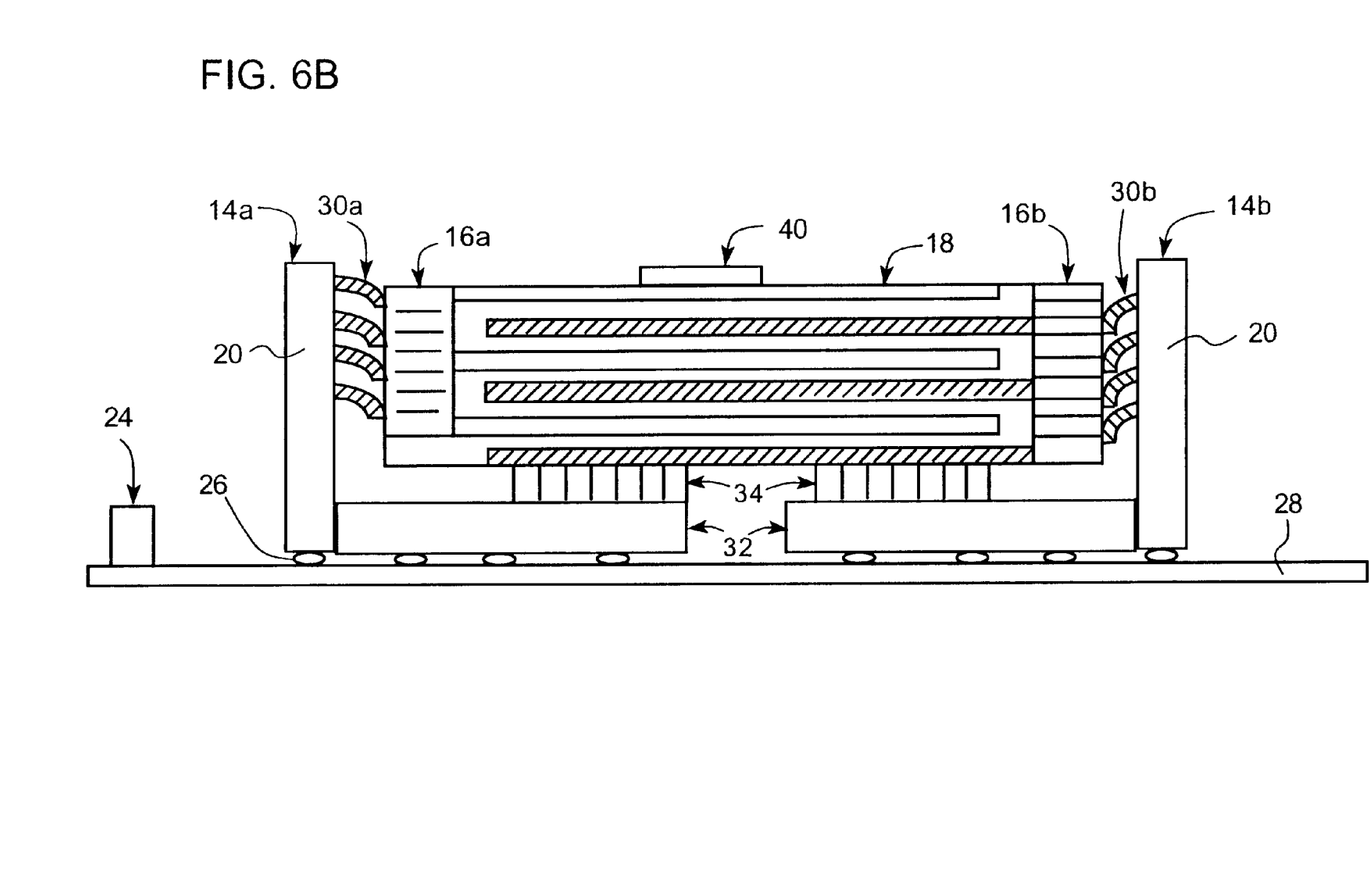

As shown in FIGS. 6A and 6B, each shunt power connection 14a, 14b includes two substantially perpendicular sections that form an L-shaped footprint. Each shunt power connection 14a, 14b provides a conductive path between a printed circuit board 28 and a contact 16a, 16b on the sides of package 18. Shunt power connection 14a is electrically coupled to a positive terminal 52 of a power source 24, and shunt power connection 14b is electrically coupled to a system ground point 54.

Figure 7:
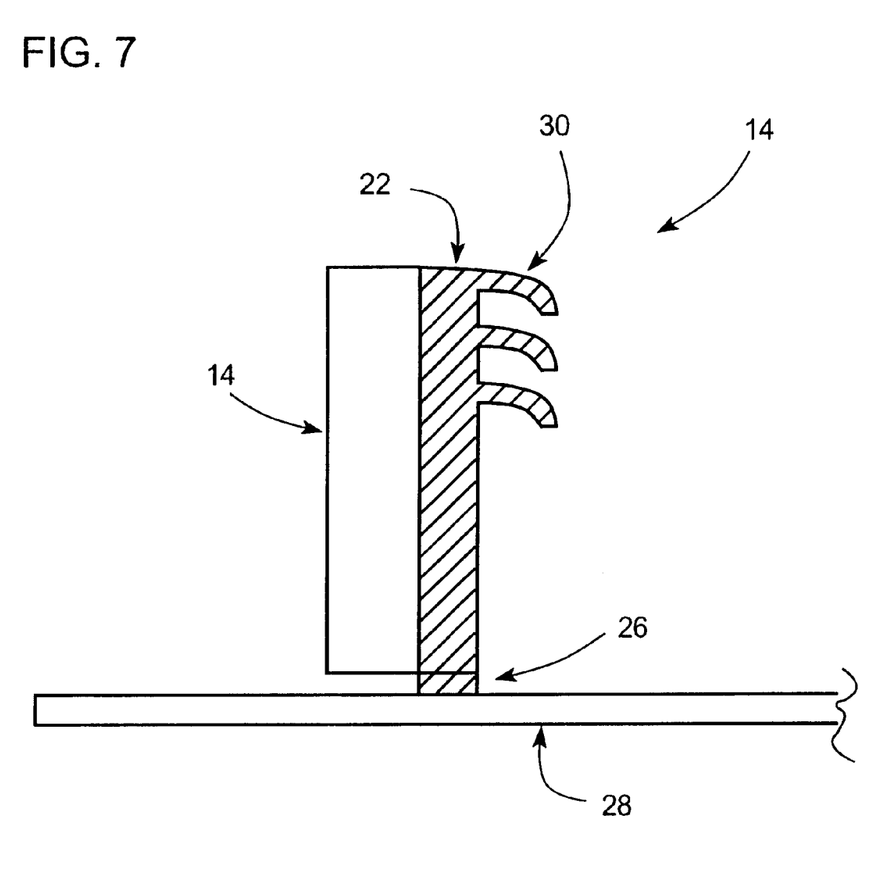
FIG. 7 is a side view of a shunt power connection.

As shown in FIG. 7, an alternative implementation of a shunt power connection 14 includes a conductive member 22 attached to a dielectric housing 14. In contrast to FIGS. 1A and 1B, the conductive member 22 is not embedded within the dielectric housing 14.

Integrated circuits incorporating the foregoing techniques may realize one or more of the following advantages. The current-carrying capability of a socket/package arrangement may be increased without excessively increasing a package's internal operating temperature. Accordingly, an integrated circuit may be able to operate at higher power levels and quicker speeds without increasing its size.

Fewer pin/socket combinations may be required to deliver power to a die and, therefore, more pin/socket combinations may be available for carrying I/O data signals and other signals.

Fewer vias dedicated to power delivery may be required to pass through a package. That can increase the space available inside a package for embedding circuit elements such as capacitors and more vias dedicated to carrying signals.

Using shunt power connections having high current carrying capacities can reduce the impedance of conductive paths between a power supply and a decoupling capacitor. That may allow the use of smaller decoupling capacitors on a package and result in a savings in package manufacturing costs.

Shunt power connections can be used with industry standard, easily available components.

Various modifications may be made. The shunt power connections can be adapted for use with ball grid array (BGA) type sockets, land grid array (LGA) type sockets, and other types of socket connections.

The configuration and shape of the fingers may differ. For example, there may be fewer or more fingers than shown, the fingers may be longer or shorter than shown, or wider or narrower than shown. Spacing between fingers can vary and may or may not be uniform. Fingers may be configured to mate with a contacts exposed at either one or more sides of a package.

Additionally, shunt socket connections may be adapted to carry different voltages, including voltages suitable for use with complementary metal oxide semiconductor (CMOS) technology or gate turnoff logic (GTL) technology. A shunt power connection can be manufactured integrally with a socket.

Other implementations are within the scope of the following claims.

What is claimed is:

1. An apparatus comprising:
a socket; and
a housing disposed about the socket, the socket and the housing effectively defining an interior region for receiving an integrated circuit package, the housing comprising a conductive member with a first portion exposed adjacent a bottom surface of the housing and a second portion comprising flexible members that extend into the interior region, wherein the flexible members are positioned at different heights from the bottom surface.

2. The apparatus of claim 1 wherein the housing comprises a dielectric material.

3. The apparatus of claim 2 wherein part of the conductive member is partially surrounded by the dielectric material.

4. The apparatus of claim 1 wherein the housing comprises a dielectric material and part of the conductive member is partially surrounded by the dielectric material.

5. The apparatus of claim 1 wherein the housing comprises a side surface facing the interior region and each flexible member extends through an opening in the side surface of the housing.

6. An apparatus comprising:
a socket adapted to receive an integrated circuit package; and
a shunt power connection proximate the socket, the shunt power connection comprising a conductive member having a first portion exposed adjacent a bottom surface of the shunt power connection and a second portion comprising flexible members adapted to electrically contact a conductive element on a side surface of the integrated circuit package, wherein the flexible members are positioned at different heights from the bottom surface.

7. The apparatus of claim 6 wherein the shunt power connection comprises a dielectric material.

8. The apparatus of claim 7 wherein part of the conductive member is partially surrounded by the dielectric material.

9. The apparatus of claim 6 wherein the shunt power connection comprises a dielectric material, and part of the conductive member is partially surrounded by the dielectric material.

10. The apparatus of claim 6 further comprising a dielectric housing having a side surface, wherein each flexible member extends through an opening in the side surface of the dielectric housing.

11. An assembly comprising:
an integrated circuit package including a conductive element exposed at a side surface of the package;
a socket; and
a housing disposed about the socket, the socket and the housing defining an interior region in which the integrated circuit package is located, the housing comprising a conductive member with a first portion exposed adjacent a bottom surface of the housing and a second portion at a surface adjacent the interior region, the second portion comprising flexible members electrically in contact with the conductive element of the package, wherein the flexible members are positioned at different heights from the bottom surface.

12. The assembly of claim 11 comprising a printed circuit board, wherein the first portion of the conductive member is electrically in contact with the printed circuit board.

13. The assembly of claim 12 comprising a power source, wherein the first portion of the conductive member is electrically coupled to the power source.

14. The assembly of claim 11 wherein the housing comprises a dielectric material.

15. The assembly of claim 11 wherein part of the conductive member is partially surrounded by the dielectric material.

16. The assembly of claim 15 wherein the second portion of the conductive member comprises discrete sections, the integrated circuit package comprises conductive contacts on side surfaces of the integrated circuit package, and each discrete section of the second portion is electrically in contact with a corresponding conductive contact on a side surface of the integrated circuit package.

17. The assembly of claim 11 comprising a printed circuit board, wherein the first portion of the conductive member is electrically in contact with the printed circuit board, the housing comprises a dielectric material, and part of the conductive member is partially surrounded by the dielectric material.

18. The assembly of claim 11 wherein the housing comprises a side surface facing the interior region and each flexible member extends through an opening in the side surface of the housing.

19. An assembly comprising:

a socket;

an integrated circuit package connected to the socket and including a conductive element at a side surface of the integrated circuit package; and a shunt power connection proximate the socket, the shunt power connection comprising a conductive member with a first portion exposed adjacent a bottom surface of the shunt power connection and a second portion comprising flexible members that extend from a side surface of the shunt power connection to contact the conductive element at the side surface of the integrated circuit package, wherein the flexible members are positioned at different heights from the bottom surface.

20. The assembly of claim 19 comprising a printed circuit board, wherein the first portion of the conductive member is electrically in contact with the printed circuit board.

21. The assembly of claim 20 comprising a power source, wherein the first portion of the conductive member is electrically coupled to the power source.

22. The assembly of claim 19 wherein the shunt power connection comprises a dielectric material.

23. The assembly of claim 22 wherein part of the conductive member is partially surrounded by the dielectric material.

24. The assembly of claim 19 wherein the second portion of the conductive member comprises discrete sections, the integrated circuit package comprises conductive contacts on side surfaces of the integrated circuit package, and each discrete section of the second portion is electrically in contact with a corresponding conductive contact on a side surface of the integrated circuit package.

25. The assembly of claim 19 comprising a printed circuit board wherein the first portion of the conductive member is electrically in contact with the printed circuit board, the shunt power connection comprises a dielectric material, and part of the conductive member is partially surrounded by the dielectric material.

26. The assembly of claim 19 wherein the side surface of the shunt power connection faces the conductive element of the integrated circuit package and each flexible member extends through an opening in the side surface of the shunt power connection.

* * * * *